United States Patent
Tashiro et al.

(10) Patent No.: US 12,211,674 B2
(45) Date of Patent: Jan. 28, 2025

(54) PLASMA PROCESSING APPARATUS

(71) Applicant: HITACHI HIGH-TECH CORPORATION, Tokyo (JP)

(72) Inventors: Shunsuke Tashiro, Tokyo (JP); Shengnan Yu, Tokyo (JP); Takashi Uemura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/913,581

(22) PCT Filed: May 17, 2021

(86) PCT No.: PCT/JP2021/018561
§ 371 (c)(1),
(2) Date: Sep. 22, 2022

(87) PCT Pub. No.: WO2022/244041
PCT Pub. Date: Nov. 24, 2022

(65) Prior Publication Data
US 2024/0222096 A1    Jul. 4, 2024

(51) Int. Cl.
*H01J 37/32* (2006.01)
(52) U.S. Cl.
CPC . *H01J 37/32834* (2013.01); *H01J 2237/3341* (2013.01)
(58) Field of Classification Search
None
See application file for complete search history.

(56) References Cited

U.S. PATENT DOCUMENTS 9,822,450 B2 * 11/2017 Nakazawa ............ C23C 14/564
10,692,784 B2 * 6/2020 Ichino ..................... H01L 22/30
(Continued)

FOREIGN PATENT DOCUMENTS

JP   2005-016379 A   6/2005
JP   2005-252201 A   9/2005
(Continued)

OTHER PUBLICATIONS

Office Action mailed Nov. 22, 2022 in Taiwanese Application No. 111118054.
(Continued)

*Primary Examiner* — Srinivas Sathiraju
(74) *Attorney, Agent, or Firm* — Miles & Stockbridge, P.C.

(57) ABSTRACT

A plasma processing apparatus for finely adjusting conductance of exhaust gas and controlling pressure in a processing chamber with high accuracy, including a processing chamber; a base plate formed with an exhaust opening; an exhaust portion lid disposed in the processing chamber so as to face the exhaust opening; an exhaust device configured to exhaust a gas in the processing chamber via the exhaust opening; and an actuator configured to drive the exhaust portion lid. An axis of the exhaust opening coincides with a central axis of the processing chamber. The exhaust portion lid includes a circular plate portion and a protruding portion protruding from the circular plate portion toward the exhaust opening. The exhaust portion lid is driven by the actuator to be movable to various positions with respect to the exhaust opening and the base plate.

9 Claims, 6 Drawing Sheets

(56) References Cited

U.S. PATENT DOCUMENTS

| | | | |
|---|---|---|---|
| 11,600,472 B2* | 3/2023 | Isomura | H01L 21/67184 |
| 11,710,619 B2* | 7/2023 | Sato | H01J 37/32733 |
| | | | 156/345.54 |
| 11,776,792 B2* | 10/2023 | Tashiro | H01J 37/32449 |
| | | | 438/695 |
| 2003/0003749 A1 | 1/2003 | Sexton et al. | |
| 2005/0193953 A1* | 9/2005 | Makino | H01J 37/32513 |
| | | | 118/733 |
| 2014/0044502 A1* | 2/2014 | Uemura | H01L 21/67745 |
| | | | 414/217 |
| 2014/0202995 A1* | 7/2014 | Miyake | H01J 37/32522 |
| | | | 219/121.37 |
| 2014/0261182 A1* | 9/2014 | Nakazawa | C23C 14/564 |
| | | | 118/723 R |
| 2014/0305915 A1* | 10/2014 | Miyake | H05H 1/46 |
| | | | 219/121.52 |
| 2015/0156856 A1* | 6/2015 | Miyake | H01J 37/32091 |
| | | | 219/412 |
| 2015/0214014 A1 | 7/2015 | Sato et al. | |
| 2015/0267294 A1* | 9/2015 | Itatani | H01L 21/68735 |
| | | | 438/758 |
| 2016/0217976 A1* | 7/2016 | Uemura | C23C 16/46 |
| 2016/0372305 A1* | 12/2016 | Uemura | H01J 37/3288 |
| 2018/0211893 A1* | 7/2018 | Ichino | H01L 21/67011 |
| 2019/0157053 A1* | 5/2019 | Isomura | H01J 37/185 |
| 2019/0189403 A1* | 6/2019 | Himbele | H01J 37/32192 |
| 2019/0267219 A1* | 8/2019 | Uemura | H01J 37/32834 |
| 2022/0115212 A1* | 4/2022 | Tashiro | H01J 37/32449 |
| 2022/0115217 A1* | 4/2022 | Yu | H01J 37/32733 |
| 2023/0197419 A1* | 6/2023 | Lee | H01L 21/67109 |
| | | | 315/111.21 |

FOREIGN PATENT DOCUMENTS

| | | |
|---|---|---|
| JP | 2012-054491 A | 3/2012 |
| JP | 2015-141908 A | 8/2015 |
| JP | 2015-183211 A | 10/2015 |
| JP | 2017-010624 A | 1/2017 |
| JP | 2019-091863 A | 6/2019 |
| JP | 2019-145721 A | 8/2019 |
| TW | 201027589 A | 7/2010 |
| TW | 201820462 A | 6/2018 |
| TW | 201937588 A | 9/2019 |
| TW | 202111838 A | 3/2021 |
| WO | 2005024926 A1 | 3/2005 |
| WO | WO2013094200 A1 | 6/2013 |

OTHER PUBLICATIONS

Search Report mailed Jul. 13, 2021 in International Application No. PCT/JP2021/018561.

Written Opinion mailed Jul. 13, 2021 in International Application No. PCT/JP2021/018561.

* cited by examiner

[FIG. 1]
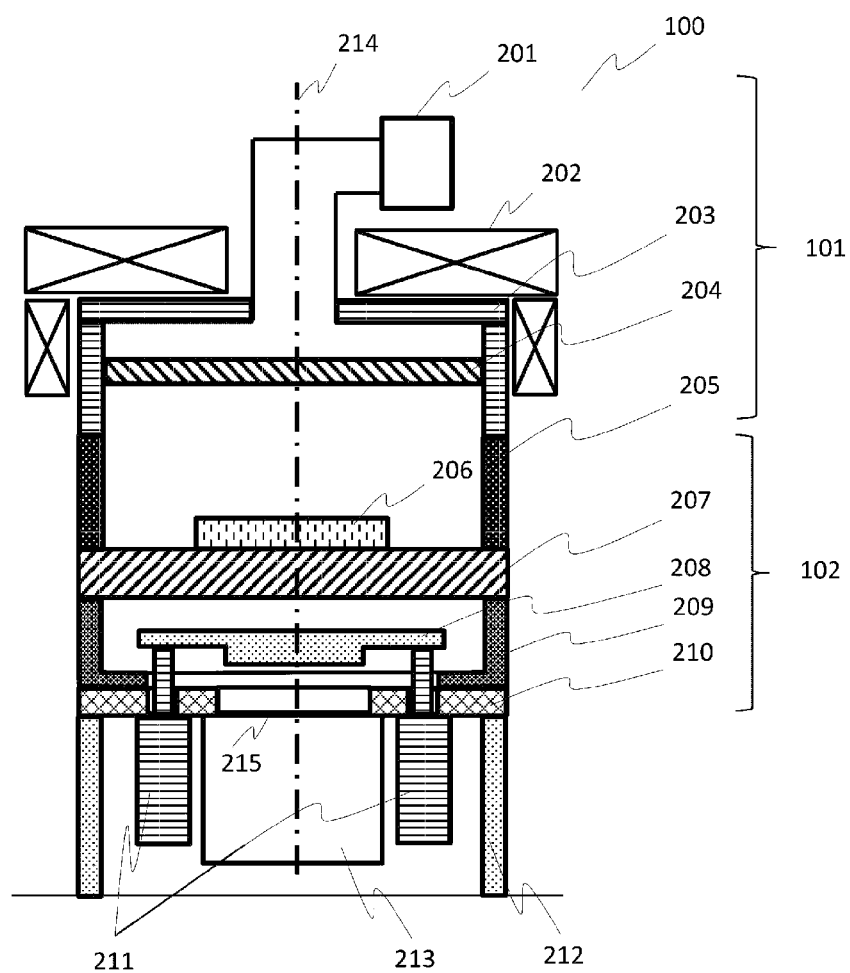

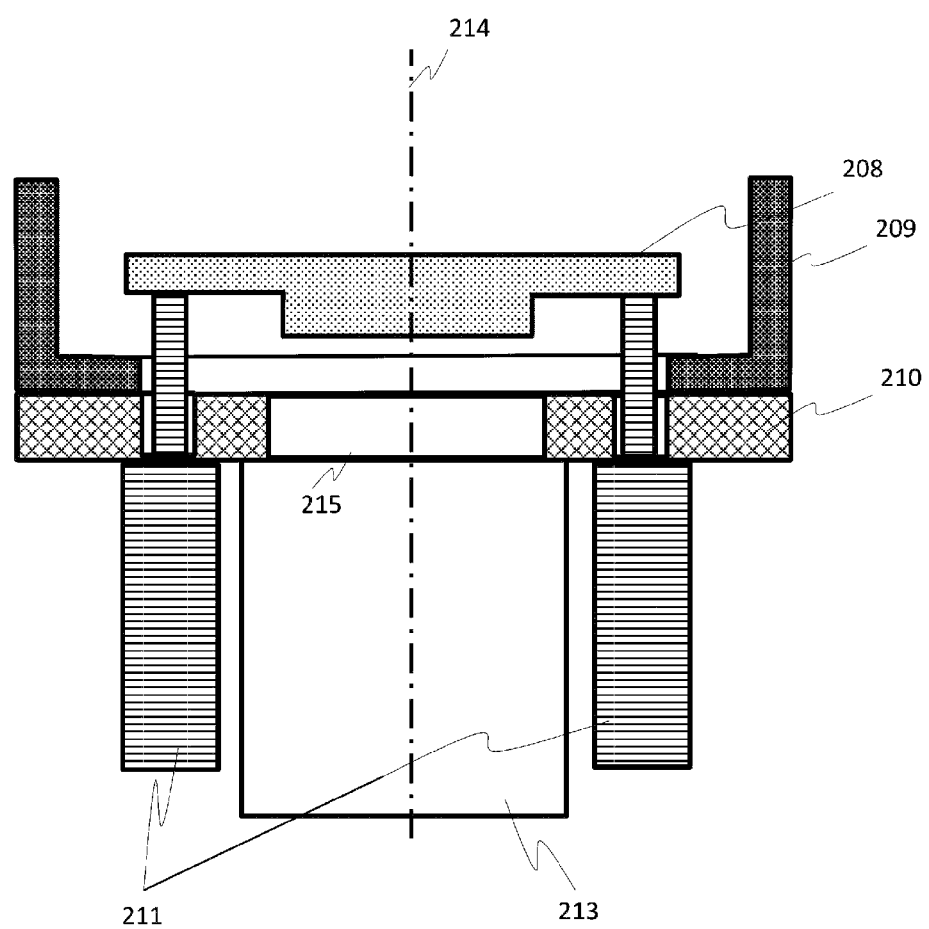
[FIG. 2]

[FIG. 3]
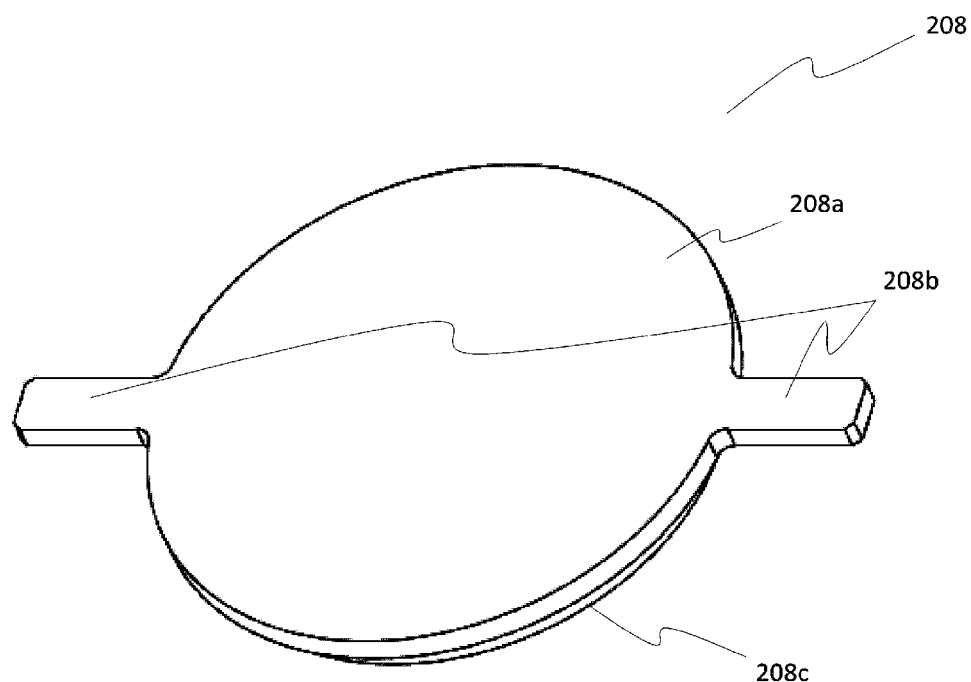

[FIG. 4]
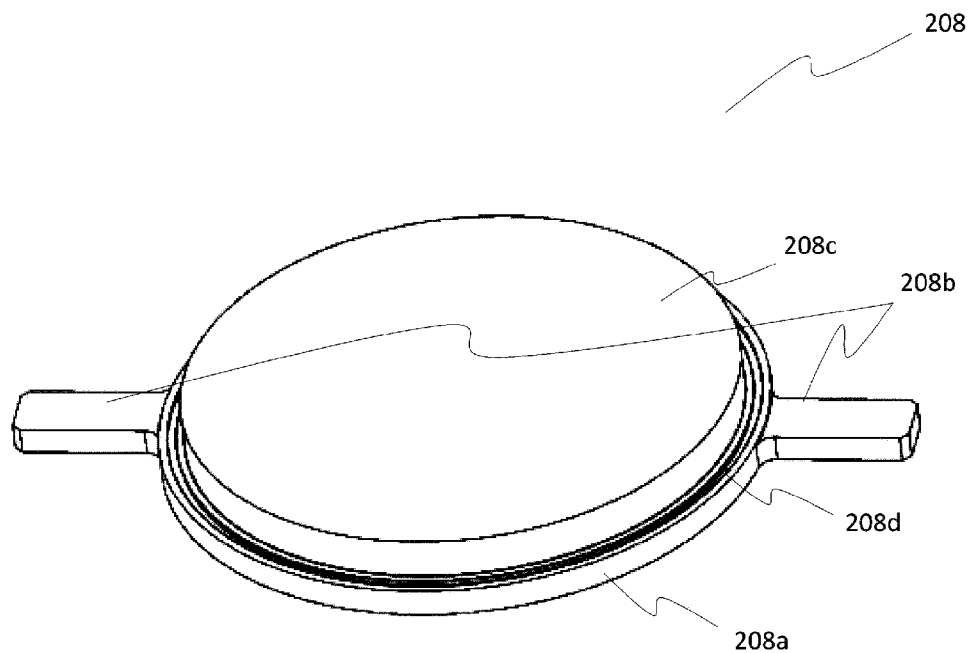

[FIG. 5]
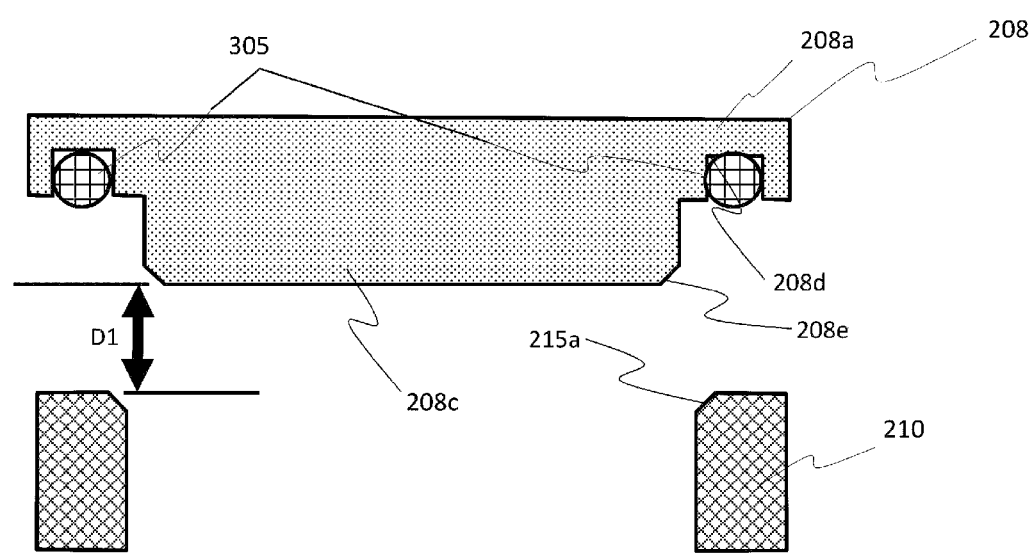

[FIG. 6]
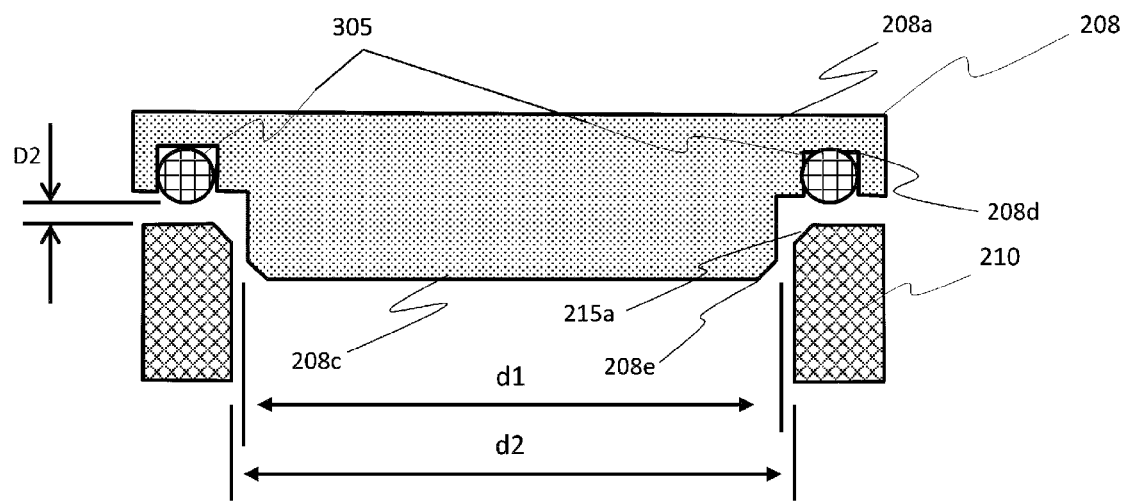
[FIG. 7]
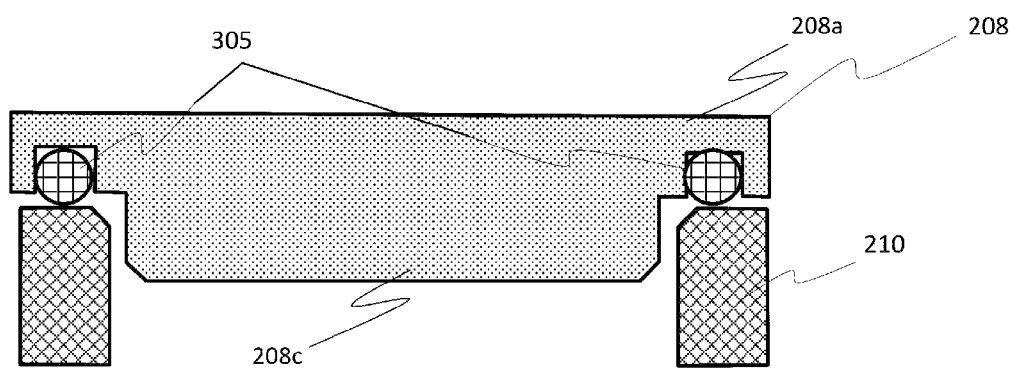

PLASMA PROCESSING APPARATUS

TECHNICAL FIELD

The present invention relates to a plasma processing apparatus.

BACKGROUND ART

In a plasma processing apparatus that processes a sample such as a semiconductor wafer, it is required to form more uniform plasma having a higher density in a processing chamber in order to implement fine and highly accurate processing. In order to stably form such plasma having a high density, it is important to stabilize a pressure in the processing chamber inside a vacuum container at a higher degree of vacuum (lower pressure).

In a related-art plasma processing apparatus, an exhaust device such as a vacuum pump is connected to a processing chamber disposed inside a vacuum container in order to exhaust a gas or plasma inside the processing chamber or particles of a product or the like generated in accordance with processing.

Further, an adjusting device that adjusts an exhaust amount per unit time is disposed in an exhaust passage extending from inside of the processing chamber toward an inlet of the vacuum pump, and the adjusting device adjusts the exhaust amount of the gas or the particles inside the processing chamber so as to adjust a pressure in the processing chamber where the plasma is formed.

More specifically, in the related-art plasma processing apparatus, an adjusting unit, which adjusts a resistance and flow ease of a flow (conductance) of a gas discharged from an exhaust port in a lower portion of the processing chamber in the vacuum container to the inlet of the vacuum pump, is disposed in a passage communicating the exhaust port with the inlet, whereby an amount of the gas discharged from the vacuum container is adjusted to adjust an internal pressure of the vacuum container.

As the adjusting unit that adjusts the resistance and the flow ease of the flow described above, there has been developed a valve that changes a size and an area of an opening of the passage, the inlet, or the exhaust port, and there has been known an adjusting unit that adjusts the size and the area of the opening by rotation of such a valve or movement of the valve in a direction crossing an axis of a pipe line.

For example, PTL 1 discloses an example of such a valve. In this related-art technique, a slidable gate valve capable of opening and closing is provided in order to adjust a resistance and flow ease of a flow of a gas passing through a gate. An area of the gate through which the gas passes can be variably adjusted by the gate valve, and thus an internal pressure of a vacuum container can be adjusted.

CITATION LIST

Patent Literature

PTL 1: JP-A-2012-054491
PTL 2: JP-A-2017-010624

SUMMARY OF INVENTION

Technical Problem

However, in the technique of PTL 1, when highly accurate pressure control is performed in a region having a higher pressure in a processing chamber, it is difficult to adjust the gate valve between a sealed state and a slightly opened state (referred to as an extremely low opening degree). Therefore, a conductance difference between exhaust amounts may tend to be large, and accuracy of the pressure control may be lowered.

In contrast, PTL 2 discloses a configuration in which an O-ring is provided on an exhaust portion lid that is movable up and down by a lifter, the exhaust portion lid is pressed against a base plate via the O-ring to block a flow of a gas passing through the base plate, and the exhaust portion lid is separated from the base plate to allow the flow of the gas passing through the base plate.

According to a technique of PTL 2, the exhaust portion lid is provided with a groove having a diameter larger than that of a cylindrical exhaust opening of the base plate, and the O-ring is embedded in the groove. Therefore, when the base plate and the O-ring are brought into contact with each other at an opening degree of 0, a conductance is 0, and thus a vacuum container can be sealed.

However, according to the technique of PTL 2, there is a problem because the following points are not sufficiently considered.

In order to perform pressure control on the vacuum container in a high pressure region, it is necessary to adjust the conductance of an exhaust amount by reducing a distance between the base plate and the O-ring embedded in the exhaust portion lid, and therefore, the exhaust portion lid is required to be controlled at an extremely low opening degree. However, the conductance of the exhaust amount at the extremely low opening degree highly depends on protrusion (an amount of protrusion from a groove edge) of the O-ring embedded in the lid. Even when an opening degree is the same, protrusion of the O-ring differs between chambers, and a conductance differs due to the protrusion, which is a factor of a machine difference.

Further, since the conductance of the exhaust amount at the extremely low opening degree also depends on a compression amount of the O-ring, a variation in the pressure control due to the machine difference may be large.

An object of the invention is to provide a plasma processing apparatus capable of finely adjusting a conductance of an exhaust gas and controlling a pressure in a processing chamber with high accuracy.

Solution to Problem

In order to achieve the above object, one of typical plasma processing apparatuses according to the invention is a plasma processing apparatus including: a processing chamber; a base plate formed with an exhaust opening connected to the processing chamber; an exhaust portion lid disposed in the processing chamber so as to face the exhaust opening; an exhaust device configured to exhaust a gas in the processing chamber via the exhaust opening; and an actuator configured to drive the exhaust portion lid.

An axis of the exhaust opening coincides with a central axis of the processing chamber.

The exhaust portion lid includes a circular plate portion and a protruding portion protruding from the circular plate portion toward the exhaust opening.

The exhaust portion lid is driven by the actuator to be movable to any one of a first position where the protruding portion and the exhaust opening are separated from each other in an axial direction, a second position where a position of the protruding portion in the axial direction overlaps that of the exhaust opening, and a third position where the circular plate portion abuts on the base plate.

Advantageous Effects of Invention

According to the invention, it is possible to provide a plasma processing apparatus capable of finely adjusting a conductance of an exhaust gas and controlling a pressure in a processing chamber with high accuracy.

Technical problems, configurations and effects other than those described above will be clarified by description of the following embodiment.

BRIEF DESCRIPTION OF DRAWINGS

FIG. 1 is a vertical cross-sectional view showing an outline of an overall configuration of a plasma processing apparatus according to an embodiment of the invention.

FIG. 2 is a vertical cross-sectional view schematically showing a lower portion of a vacuum processing unit in FIG. 1 according to the embodiment of the invention.

FIG. 3 is a perspective view schematically showing an exhaust portion lid in FIG. 2 according to the present embodiment.

FIG. 4 is a perspective view schematically showing the exhaust portion lid in FIG. 2 according to the present embodiment.

FIG. 5 is a vertical cross-sectional view schematically showing a positional relationship between the exhaust portion lid and a base plate having an exhaust opening according to the present embodiment, and shows a first position.

FIG. 6 is a vertical cross-sectional view schematically showing a positional relationship between the exhaust portion lid and the base plate having the exhaust opening according to the present embodiment, and shows a second position.

FIG. 7 is a vertical cross-sectional view schematically showing a positional relationship between the exhaust portion lid and the base plate having the exhaust opening according to the present embodiment, and shows a third position.

DESCRIPTION OF EMBODIMENTS

Hereinafter, an embodiment of the invention will be described with reference to the drawings.

FIG. 1 is a vertical cross-sectional view schematically showing an outline of an overall configuration of a plasma processing apparatus according to the present embodiment.

A plasma processing apparatus 100 according to the present embodiment shown in FIG. 1 includes an electromagnetic wave supply unit 101 and a vacuum processing unit 102. The electromagnetic wave supply unit 101 is a unit that forms plasma by causing an electric field and a magnetic field to interact with each other by electron cyclotron resonance (ECR). The vacuum processing unit 102 is a unit that performs etching on a sample such as a wafer under a reduced pressure using the plasma and a specific gas.

The electromagnetic wave supply unit 101 includes a high frequency power supply 201 that forms the electric field for plasma formation, and a solenoid coil 202 that is a device that forms the magnetic field. The electric field and the magnetic field excite particles such as atoms or molecules of a processing gas supplied to an upper portion of a circular plate-shaped shower plate 204 provided inside a cylindrical discharge block unit 203, and ionize or dissociate the particles to form the plasma. By the plasma, etching is performed on a film structure including a mask formed in advance on an upper surface of a substrate-shaped sample such as a semiconductor wafer 206 disposed in a processing chamber and a film layer to be processed.

The vacuum processing unit 102 includes a vacuum container including an upper container 205 and a lower container 209 containing the processing chamber where the plasma is formed, and an exhaust pump (exhaust device) 213 including a vacuum pump such as a turbo molecular pump disposed below the vacuum container. A stage 207 on which the wafer 206 is placed is disposed inside the processing chamber. Outer surfaces of the upper container 205 and the lower container 209 are exposed to an atmosphere (atmospheric air) around the vacuum processing unit 102, and the vacuum container including the upper container 205 and the lower container 209 constitutes a vacuum partition wall that hermetically partitions the processing chamber inside the vacuum container from the external atmosphere.

A base plate 210 having an exhaust opening 215 for discharging the gas and plasma particles in the processing chamber is supported by a support 212 below the vacuum container of the vacuum processing unit 102. The exhaust opening 215 connected to the exhaust pump 213 and having a circular shape is disposed directly below the stage 207, and an axis of the exhaust opening 215 is disposed at an equivalent position that coincides with a central axis 214 of the processing chamber or is close to the central axis 214 of the processing chamber to an extent that the axis can be regarded as the central axis 214. This state is expressed here as the axis of the exhaust opening 215 coincides with the central axis 214 of the processing chamber.

Next, pressure control of the vacuum processing unit 102 according to the present embodiment will be described with reference to FIGS. 2 and 3. FIG. 2 is a vertical cross-sectional view schematically showing an outline of a lower portion of the vacuum processing unit 102 shown in FIG. 1. FIG. 3 is a perspective view of an exhaust portion lid 208 as viewed from above.

In FIG. 2, the exhaust portion lid 208 having a substantially circular plate shape is disposed above the exhaust opening 215. As shown in FIG. 3, the exhaust portion lid 208 includes a circular plate portion 208a, a pair of arm portions 208b protruding radially outward (in a left-right direction in FIG. 3) from an outer circumference of the circular plate portion 208a so as to be opposite to each other, and a cylindrical protruding portion 208c having a diameter smaller than that of the circular plate portion 208a and formed so as to protrude downward from the circular plate portion 208a.

Each of the arm portions 208b is connected to a telescopic shaft disposed in a vertical direction of an actuator 211. When power is supplied to the actuator 211 from outside, the telescopic shaft extends and contracts. Extension and contraction drive of the telescopic shaft causes the exhaust portion lid 208 to move up and down via the arm portions 208b, whereby a distance to the exhaust opening 215 is changed. Accordingly, a conductance of an exhaust gas from the processing chamber is adjusted.

During processing of the wafer 206, a flow rate or a speed of the gas, the plasma, or a product inside discharged to outside of the processing chamber is adjusted by a value of the conductance and an exhaust amount per unit time of the exhaust pump 213, and a pressure in the processing chamber is adjusted to a desired degree of vacuum by a balance between the exhaust and supply of the processing gas.

FIG. 4 is a perspective view of the exhaust portion lid 208 as viewed from below. An O-ring groove 208d is formed on a lower surface of the circular plate portion 208a radially outward of the protruding portion 208c.

With reference to FIG. 5, a downward chamfered portion 208e having a tapered shape is formed on an outer circumference of a lower end of the protruding portion 208c, and an upward chamfered portion 215a is formed on an inner circumference of an upper end of the exhaust opening 215 of the base plate 210 so as to face the downward chamfered portion 208e. With reference to FIG. 6, an outer diameter of the protruding portion 208c is denoted by d1, and an inner diameter of the exhaust opening 215 is denoted by d2.

Positions of the exhaust portion lid 208 when the telescopic shaft of the actuator 211 is driven in a stepwise manner in an upper-lower direction are schematically shown in FIGS. 5, 6, and 7, but the arm portions are omitted.

FIG. 5 shows a state in which the lower end of the protruding portion 208c of the exhaust portion lid 208 and an upper surface of the base plate 210 are separated from each other in an axial direction, and the position of the exhaust portion lid 208 at this time is referred to as a first position. At the first position, a conductance of an exhaust amount depends on a distance D1 between the lower end of the protruding portion 208c of the exhaust portion lid 208 and the upper surface of the base plate 210. The conductance is the same even when the exhaust portion lid 208 does not include the protruding portion 208c.

FIG. 6 shows a state in which the protruding portion 208c of the exhaust portion lid 208 enters the exhaust opening 215 of the base plate 210 and positions thereof in the axial direction overlap each other, and the position of the exhaust portion lid 208 at this time is referred to as a second position. At the second position, a distance ((d1−d2)/2) between the outer diameter of the protruding portion 208c of the exhaust portion lid 208 and the inner diameter of the exhaust opening 215 is smaller than a distance D2 between the upper surface of the base plate 210 and a lower end of an O-ring 305 attached to the exhaust portion lid 208. This case shows that the conductance of the exhaust amount depends on a difference (d1−d2) between the outer diameter of the protruding portion 208c of the exhaust portion lid 208 and the inner diameter of the exhaust opening 215.

When the telescopic shaft of the actuator 211 is moved up and down in a state where the protruding portion 208c of the exhaust portion lid 208 enters the exhaust opening 215 of the base plate 210, an overlapping amount of the protruding portion 208c and the exhaust opening 215 changes according to relative positions of the exhaust portion lid 208 and the base plate 210, and a resistance of the gas passing through an annular space formed by an outer circumference of the protruding portion 208c of the exhaust portion lid 208 and an inner circumference of the exhaust opening 215 slightly changes, that is, the conductance can be finely adjusted.

The conductance depends on a shape of the protruding portion 208c of the exhaust portion lid 208, and for example, the conductance is smaller than that of an exhaust portion lid including no protruding portion. Therefore, according to the present embodiment, the vacuum processing unit 102 can be controlled with high accuracy in a high pressure region.

Since the conductance of the exhaust amount depends on the difference between the outer diameter of the protruding portion 208c of the exhaust portion lid 208 and the inner diameter of the exhaust opening 215, it is possible to eliminate an influence of a machine difference such as a compression amount of the O-ring 305 on the conductance and to limit an influence only to an influence of a mechanical tolerance of the actuator 211 or the like having a relatively small variation.

Further, in the state of FIG. 6, the conductance changes depending on dimensions of the downward chamfered portion 208e and the upward chamfered portion 215a. That is, desired conductance characteristics can be obtained by setting the dimensions of the downward chamfered portion 208e and the upward chamfered portion 215a in advance.

FIG. 7 shows a state in which the exhaust portion lid 208 is lowered to the lowest position and the O-ring 305 and the base plate 210 are in close contact with each other, and the position of the exhaust portion lid 208 at this time is referred to as a third position. At the third position, since the O-ring 305 and the base plate 210 are in close contact with each other, the conductance of the exhaust amount is 0, and a flow of the exhaust gas from the processing chamber toward the exhaust opening 215 is blocked.

In the embodiment described above, the protruding portion 208c has a solid cylindrical shape, but may have a hollow cylindrical shape. In addition, the exhaust opening 215 and the protruding portion 208c may be formed in a rectangular tubular shape instead of being formed in a cylindrical shape. And also, in the above embodiment, a height between the bottom surface of the circular plate portion 208a in the outer peripheral portion thereof, more precisely the bottom surface of the circular plate portion 208a between the O-ring groove on the outer circumference region of the protruding portion 208c in the radial direction and a base portion (upper end in FIG. 5 etc.) of an outer circumferential side wall of the protruding portion 208c, and the bottom surface of the protruding portion 208c, that is, the height of the protruding portions 208c can be smaller than the thickness of the base plate 210 or the height of the portion constituting the inner circumferential sidewall surrounding the exhaust opening 215. Alternatively, the height of the protruding portion 208c can be smaller than the distance between the bottom surface in the outer peripheral portion of the circular plate portion and the bottom surface of the base plate 210 or the portion constituting the inner circumferential sidewall surface of the exhaust opening 215 or the distance between the top surface of the portion constituting the inner circumferential side wall surrounding the exhaust opening 215, when the distance D2 is set equal to the distance D1. In such the cases, the exhaust portion lid 208 moves downward and the protruding portion 208c moves into the exhaust opening 215, and the width (height) of the area where the inner circumferential side wall of the exhaust opening 215 overlapping the outer side wall of the protruding portion 208c can increase monotonically until the O-ring 305 contacts the top surface of the portion comprising the inner circumferential wall surrounding the exhaust opening 215. Furthermore, the bottom surface of the protruding portion 208c does not project out downwardly beyond the bottom surface of the portion comprising the inner circumferential sidewall surrounding the exhaust opening 215 or the base plate 210. This causes that the fluctuation of the conductance of the exhaust through the exhausting opening 215 while the accuracy in the adjustment of the exhaust amount can be improved.

REFERENCE SIGNS LIST 100 plasma processing apparatus
101 electromagnetic wave supply unit
102 vacuum processing unit
201 high frequency power supply 202 solenoid coil
203 discharge block unit
204 shower plate
205 upper container
206 wafer
207 stage
208 exhaust portion lid
208a circular plate portion
208b arm portion
208c protruding portion
208d O-ring groove
209 lower container
210 base plate
211 actuator
212 support
213 exhaust pump
214 central axis
215 exhaust opening
305 O-ring

The invention claimed is:

1. A plasma processing apparatus comprising:
a processing chamber;
a base plate formed with an exhaust opening connected to the processing chamber;
an exhaust portion lid disposed in the processing chamber so as to face the exhaust opening;
an exhaust device configured to exhaust a gas in the processing chamber via the exhaust opening; and
an actuator configured to drive the exhaust portion lid, wherein
an axis of the exhaust opening coincides with a central axis of the processing chamber,
the exhaust portion lid includes a circular plate portion and a protruding portion protruding from the circular plate portion toward the exhaust opening, and
the exhaust portion lid is driven by the actuator to be movable to any one of a first position where the protruding portion and the exhaust opening are separated from each other in an axial direction, a second position where a position of the protruding portion in the axial direction overlaps that of the exhaust opening, and a third position where the circular plate portion abuts on the base plate,
wherein a chamfered portion is formed on an outer periphery of an end portion of the protruding portion on an exhaust opening side.

2. A plasma processing apparatus comprising:
a processing chamber;
a base plate formed with an exhaust opening connected to the processing chamber;
an exhaust portion lid disposed in the processing chamber so as to face the exhaust opening;
an exhaust device configured to exhaust a gas in the processing chamber via the exhaust opening; and
an actuator configured to drive the exhaust portion lid, wherein
an axis of the exhaust opening coincides with a central axis of the processing chamber,
the exhaust portion lid includes a circular plate portion and a protruding portion protruding from the circular plate portion toward the exhaust opening, and
the exhaust portion lid is driven by the actuator to be movable to any one of a first position where the protruding portion and the exhaust opening are separated from each other in an axial direction, a second position where a position of the protruding portion in the axial direction overlaps that of the exhaust opening, and a third position where the circular plate portion abuts on the base plate,
wherein a chamfered portion is formed on an inner periphery of an end portion of the exhaust opening on a protruding portion side.

3. The plasma processing apparatus according to claim 2, wherein
the circular plate portion has a circumferential groove on a surface facing the base plate, and an O-ring is disposed in the circumferential groove.

4. The plasma processing apparatus according to claim 3, wherein
at the third position, the circular plate portion abuts on the base plate via the O-ring.

5. The plasma processing apparatus according to claim 1, wherein
the circular plate portion has a circumferential groove on a surface facing the base plate, and an O-ring is disposed in the circumferential groove.

6. The plasma processing apparatus according to claim 5, wherein
at the third position, the circular plate portion abuts on the base plate via the O-ring.

7. A plasma processing apparatus comprising:
a processing chamber;
a base plate formed with an exhaust opening connected to the processing chamber;
an exhaust portion lid disposed in the processing chamber so as to face the exhaust opening;
an exhaust device configured to exhaust a gas in the processing chamber via the exhaust opening; and
an actuator configured to drive the exhaust portion lid, wherein
an axis of the exhaust opening coincides with a central axis of the processing chamber,
the exhaust portion lid includes a circular plate portion and a protruding portion protruding from the circular plate portion toward the exhaust opening, and
the exhaust portion lid is driven by the actuator to be movable to any one of a first position where the protruding portion and the exhaust opening are separated from each other in an axial direction, a second position where a position of the protruding portion in the axial direction overlaps that of the exhaust opening, and a third position where the circular plate portion abuts on the base plate,
wherein the exhaust portion lid includes an arm portion protruding radially outward from the circular plate portion, and the arm portion is connected to a telescopic shaft of the actuator.

8. The plasma processing apparatus according to claim 7, wherein
the circular plate portion has a circumferential groove on a surface facing the base plate, and an O-ring is disposed in the circumferential groove.

9. The plasma processing apparatus according to claim 8, wherein
at the third position, the circular plate portion abuts on the base plate via the O-ring.

* * * * *